(12) United States Patent
Chang et al.

(10) Patent No.: US 9,660,082 B2
(45) Date of Patent: May 23, 2017

(54) INTEGRATED CIRCUIT TRANSISTOR STRUCTURE WITH HIGH GERMANIUM CONCENTRATION SIGE STRESSOR

(71) Applicant: TAIWAN SEMICONDUCTOR MANUFACTURING COMPANY, LTD., Hsinchu (TW)

(72) Inventors: Chih-Hao Chang, Chu-Bei (TW); Jeff J. Xu, Jhubei (TW); Chien-Hsun Wang, Hsinchu (TW); Chih Chieh Yeh, Taipei (TW); Chih-Hsiang Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/102,702

(22) Filed: Dec. 11, 2013

(65) Prior Publication Data

US 2014/0091362 A1     Apr. 3, 2014

Related U.S. Application Data

(62) Division of application No. 12/831,842, filed on Jul. 7, 2010, now Pat. No. 8,623,728.

(Continued)

(51) Int. Cl.
| | |
|---|---|
| *H01L 29/78* | (2006.01) |
| *H01L 29/165* | (2006.01) |
| *H01L 29/66* | (2006.01) |
| *H01L 21/02* | (2006.01) |
| *H01L 29/10* | (2006.01) |

(52) U.S. Cl.
CPC .......... *H01L 29/785* (2013.01); *H01L 29/165* (2013.01); *H01L 29/66575* (2013.01); *H01L 29/66628* (2013.01); *H01L 29/7848* (2013.01); *H01L 21/0245* (2013.01); *H01L 21/02488* (2013.01); *H01L 21/02502* (2013.01); *H01L 21/02532* (2013.01); *H01L 29/1054* (2013.01);
(Continued)

(58) Field of Classification Search
None
See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |

(Continued)

FOREIGN PATENT DOCUMENTS

| | | | |
|---|---|---|---|
| CN | 1945829 | 4/2004 | |
| CN | 101179046 | 5/2005 | |

(Continued)

OTHER PUBLICATIONS

Office Action dated Jul. 31, 2013 from corresponding application No. TW099124883.

(Continued)

*Primary Examiner* — Hoang-Quan Ho
(74) *Attorney, Agent, or Firm* — Haynes and Boone, LLP

(57) ABSTRACT

An integrated circuit transistor structure includes a semiconductor substrate, a first SiGe layer in at least one of a source area or a drain area on the semiconductor substrate, and a channel between the source area and the drain area. The first SiGe layer has a Ge concentration of 50 percent or more.

16 Claims, 5 Drawing Sheets

Related U.S. Application Data

(60) Provisional application No. 61/229,253, filed on Jul. 28, 2009.

(52) U.S. Cl.
CPC .. *H01L 29/66636* (2013.01); *H01L 29/66772* (2013.01); *H01L 29/66795* (2013.01)

(56) References Cited

U.S. PATENT DOCUMENTS

| | | | |
|---|---|---|---|
| 5,767,732 A | 6/1998 | Lee et al. | |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,352,942 B1 | 3/2002 | Luan et al. | |
| 6,503,794 B1 | 1/2003 | Matsuda et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,713,365 B2 | 3/2004 | Lin et al. | |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,791,155 B1 | 9/2004 | Lo et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 | 9/2005 | Sharma et al. | |
| 6,949,768 B1 | 9/2005 | Anderson et al. | |
| 6,964,832 B2 | 11/2005 | Moniwa et al. | |
| 7,009,273 B2 | 3/2006 | Inoh et al. | |
| 7,018,901 B1 | 3/2006 | Thean et al. | |
| 7,026,232 B1 | 4/2006 | Koontz et al. | |
| 7,067,400 B2 | 6/2006 | Bedell et al. | |
| 7,078,312 B1 | 7/2006 | Sutanto et al. | |
| 7,084,079 B2 | 8/2006 | Conti et al. | |
| 7,084,506 B2 | 8/2006 | Takao | |
| 7,112,495 B2 | 9/2006 | Ko et al. | |
| 7,153,744 B2 | 12/2006 | Chen et al. | |
| 7,157,351 B2 | 1/2007 | Cheng et al. | |
| 7,190,050 B2 | 3/2007 | King et al. | |
| 7,193,399 B2 | 3/2007 | Aikawa | |
| 7,208,357 B2 | 4/2007 | Sadaka et al. | |
| 7,241,647 B2 | 7/2007 | Sadaka et al. | |
| 7,247,887 B2 | 7/2007 | King et al. | |
| 7,265,008 B2 | 9/2007 | King et al. | |
| 7,265,418 B2 | 9/2007 | Yun et al. | |
| 7,279,758 B1 * | 10/2007 | Li | H01L 21/26506 257/327 |
| 7,288,443 B2 * | 10/2007 | Zhu | H01L 21/22 257/347 |
| 7,297,600 B2 | 11/2007 | Oh et al. | |
| 7,300,837 B2 | 11/2007 | Chen et al. | |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,348,260 B2 | 3/2008 | Ghyselen | |
| 7,348,284 B2 * | 3/2008 | Doyle | H01L 21/845 257/E21.633 |
| 7,351,622 B2 | 4/2008 | Buh et al. | |
| 7,358,166 B2 | 4/2008 | Agnello et al. | |
| 7,361,563 B2 | 4/2008 | Shin et al. | |
| 7,374,986 B2 | 5/2008 | Kim et al. | |
| 7,394,116 B2 | 7/2008 | Kim et al. | |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 | 9/2008 | Liu et al. | |
| 7,427,779 B2 | 9/2008 | Damlencourt et al. | |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,550,332 B2 | 6/2009 | Yang | |
| 7,557,018 B2 | 7/2009 | Nakaharai et al. | |
| 7,598,145 B2 | 10/2009 | Damlencourt et al. | |
| 7,605,449 B2 | 10/2009 | Liu et al. | |
| 7,682,911 B2 | 3/2010 | Jang et al. | |
| 7,683,436 B2 * | 3/2010 | Nishiyama | H01L 29/66818 257/331 |
| 7,736,988 B2 | 6/2010 | Ghyselen et al. | |
| 7,759,228 B2 | 7/2010 | Sugiyama et al. | |
| 7,795,097 B2 | 9/2010 | Pas | |
| 7,798,332 B1 | 9/2010 | Brunet | |
| 7,820,513 B2 | 10/2010 | Hareland et al. | |
| 7,821,067 B2 | 10/2010 | Thean et al. | |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,339 B2 | 4/2011 | Meunier-Beillard et al. | |
| 7,960,791 B2 | 6/2011 | Anderson et al. | |
| 7,985,633 B2 | 7/2011 | Cai et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 8,067,818 B2 * | 11/2011 | Shah | H01L 29/42384 257/618 |
| 8,076,189 B2 | 12/2011 | Grant | |
| 8,101,475 B2 | 1/2012 | Oh et al. | |
| 8,211,761 B2 | 7/2012 | Tan et al. | |
| 8,247,285 B2 * | 8/2012 | Lin | H01L 21/28255 438/216 |
| 8,492,234 B2 * | 7/2013 | Chan | H01L 21/82341 257/E21.091 |
| 2003/0080361 A1 | 5/2003 | Murthy et al. | |
| 2003/0109086 A1 | 6/2003 | Arao | |
| 2003/0207555 A1 | 11/2003 | Takayanagi et al. | |
| 2003/0221611 A1 * | 12/2003 | Kondo | C23C 16/22 117/88 |
| 2003/0234422 A1 | 12/2003 | Wang et al. | |
| 2004/0036127 A1 * | 2/2004 | Chau et al. | 257/401 |
| 2004/0075121 A1 | 4/2004 | Yu et al. | |
| 2004/0129998 A1 | 7/2004 | Inoh et al. | |
| 2004/0192067 A1 | 9/2004 | Ghyselen et al. | |
| 2004/0219722 A1 | 11/2004 | Pham et al. | |
| 2004/0241398 A1 | 12/2004 | Notsu et al. | |
| 2004/0259315 A1 | 12/2004 | Sakaguchi et al. | |
| 2005/0020020 A1 | 1/2005 | Collaert et al. | |
| 2005/0051865 A1 | 3/2005 | Lee et al. | |
| 2005/0082616 A1 | 4/2005 | Chen et al. | |
| 2005/0093154 A1 * | 5/2005 | Kottantharayil | H01L 29/1054 257/745 |
| 2005/0098234 A1 | 5/2005 | Nakaharai et al. | |
| 2005/0153490 A1 | 7/2005 | Yoon et al. | |
| 2005/0170593 A1 | 8/2005 | Kang et al. | |
| 2005/0208780 A1 | 9/2005 | Bedell et al. | |
| 2005/0212080 A1 | 9/2005 | Wu et al. | |
| 2005/0221591 A1 | 10/2005 | Bedell et al. | |
| 2005/0224800 A1 | 10/2005 | Lindert et al. | |
| 2005/0233598 A1 | 10/2005 | Jung et al. | |
| 2005/0266698 A1 | 12/2005 | Cooney et al. | |
| 2005/0272192 A1 * | 12/2005 | Oh | H01L 29/66553 438/197 |
| 2005/0280102 A1 | 12/2005 | Oh et al. | |
| 2005/0285192 A1 * | 12/2005 | Zhu | H01L 21/22 257/347 |
| 2006/0001088 A1 * | 1/2006 | Chan | H01L 21/2007 257/347 |
| 2006/0033095 A1 * | 2/2006 | Doyle | H01L 21/845 257/19 |
| 2006/0038230 A1 | 2/2006 | Ueno et al. | |
| 2006/0046388 A1 * | 3/2006 | Park | H01L 21/28273 438/257 |

(56) References Cited

U.S. PATENT DOCUMENTS

| | | | |
|---|---|---|---|
| 2006/0068553 A1 | 3/2006 | Thean et al. | |
| 2006/0076625 A1* | 4/2006 | Lee | H01L 29/7851 257/353 |
| 2006/0091481 A1 | 5/2006 | Li et al. | |
| 2006/0091482 A1 | 5/2006 | Kim et al. | |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |
| 2006/0151808 A1 | 7/2006 | Chen et al. | |
| 2006/0153995 A1 | 7/2006 | Narwankar et al. | |
| 2006/0166475 A1 | 7/2006 | Mantl | |
| 2006/0214212 A1 | 9/2006 | Horita et al. | |
| 2006/0258156 A1 | 11/2006 | Kittl | |
| 2007/0001173 A1 | 1/2007 | Brask et al. | |
| 2007/0004218 A1 | 1/2007 | Lee et al. | |
| 2007/0015334 A1 | 1/2007 | Kittl et al. | |
| 2007/0020827 A1 | 1/2007 | Buh et al. | |
| 2007/0024349 A1 | 2/2007 | Tsukude | |
| 2007/0029576 A1 | 2/2007 | Nowak et al. | |
| 2007/0048907 A1 | 3/2007 | Lee et al. | |
| 2007/0076477 A1 | 4/2007 | Hwang et al. | |
| 2007/0093010 A1 | 4/2007 | Mathew et al. | |
| 2007/0093036 A1 | 4/2007 | Cheng et al. | |
| 2007/0096148 A1 | 5/2007 | Hoentschel et al. | |
| 2007/0108481 A1 | 5/2007 | Thean et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0131969 A1 | 6/2007 | Sanuki et al. | |
| 2007/0132053 A1 | 6/2007 | King et al. | |
| 2007/0145487 A1 | 6/2007 | Kavalieros et al. | |
| 2007/0152276 A1 | 7/2007 | Arnold et al. | |
| 2007/0164344 A1* | 7/2007 | Park | H01L 21/28273 257/314 |
| 2007/0166929 A1 | 7/2007 | Matsumoto et al. | |
| 2007/0178637 A1 | 8/2007 | Jung et al. | |
| 2007/0207598 A1 | 9/2007 | Damlencourt et al. | |
| 2007/0221956 A1 | 9/2007 | Inaba | |
| 2007/0236278 A1 | 10/2007 | Hur et al. | |
| 2007/0238268 A1* | 10/2007 | Leusink | H01L 21/0214 438/478 |
| 2007/0241414 A1 | 10/2007 | Narihiro | |
| 2007/0247906 A1 | 10/2007 | Watanabe et al. | |
| 2007/0254440 A1 | 11/2007 | Daval | |
| 2008/0001171 A1 | 1/2008 | Tezuka et al. | |
| 2008/0036001 A1 | 2/2008 | Yun et al. | |
| 2008/0042209 A1 | 2/2008 | Tan et al. | |
| 2008/0050882 A1 | 2/2008 | Bevan et al. | |
| 2008/0054347 A1* | 3/2008 | Wang | H01L 29/6653 257/327 |
| 2008/0085580 A1 | 4/2008 | Doyle et al. | |
| 2008/0085590 A1 | 4/2008 | Yao et al. | |
| 2008/0095954 A1 | 4/2008 | Gabelnick et al. | |
| 2008/0102586 A1 | 5/2008 | Park | |
| 2008/0124878 A1 | 5/2008 | Cook et al. | |
| 2008/0227241 A1 | 9/2008 | Nakabayashi et al. | |
| 2008/0265344 A1 | 10/2008 | Mehrad et al. | |
| 2008/0290470 A1 | 11/2008 | King et al. | |
| 2008/0296632 A1 | 12/2008 | Moroz et al. | |
| 2008/0318392 A1 | 12/2008 | Hung et al. | |
| 2009/0020783 A1* | 1/2009 | Zhang | H01L 29/165 257/190 |
| 2009/0026540 A1 | 1/2009 | Sasaki et al. | |
| 2009/0039388 A1 | 2/2009 | Teo et al. | |
| 2009/0066763 A1 | 3/2009 | Fujii et al. | |
| 2009/0085027 A1* | 4/2009 | Jin et al. | 257/24 |
| 2009/0155969 A1 | 6/2009 | Chakravarti et al. | |
| 2009/0166625 A1 | 7/2009 | Ting et al. | |
| 2009/0181477 A1 | 7/2009 | King et al. | |
| 2009/0194788 A1* | 8/2009 | Liu | H01L 21/26506 257/190 |
| 2009/0200612 A1 | 8/2009 | Koldiaev | |
| 2009/0239347 A1 | 9/2009 | Ting et al. | |
| 2009/0261349 A1* | 10/2009 | Lee | H01L 29/0847 257/77 |
| 2009/0261381 A1 | 10/2009 | Kim et al. | |
| 2009/0309646 A1* | 12/2009 | Kobayashi | G06F 7/588 327/355 |
| 2009/0321836 A1 | 12/2009 | Wei et al. | |
| 2010/0044781 A1* | 2/2010 | Tanabe | H01L 29/1054 257/327 |
| 2010/0155790 A1* | 6/2010 | Lin | H01L 21/28255 257/288 |
| 2010/0163926 A1 | 7/2010 | Hudait et al. | |
| 2010/0187613 A1 | 7/2010 | Colombo et al. | |
| 2010/0207211 A1 | 8/2010 | Sasaki et al. | |
| 2010/0308379 A1 | 12/2010 | Kuan et al. | |
| 2011/0018065 A1 | 1/2011 | Curatola et al. | |
| 2011/0045646 A1* | 2/2011 | Kouvetakis | C23C 16/04 438/285 |
| 2011/0108920 A1 | 5/2011 | Basker et al. | |
| 2011/0129990 A1 | 6/2011 | Mandrekar et al. | |
| 2011/0195555 A1 | 8/2011 | Tsai et al. | |
| 2011/0195570 A1 | 8/2011 | Lin et al. | |
| 2011/0256682 A1 | 10/2011 | Yu et al. | |
| 2012/0086053 A1 | 4/2012 | Tseng et al. | |

FOREIGN PATENT DOCUMENTS

| | | | |
|---|---|---|---|
| CN | 100481345 | 4/2009 | |
| CN | 1011459116 | 6/2009 | |
| JP | 2006-19727 | 1/2006 | |
| JP | 2006-108365 | 4/2006 | |
| JP | 2007-194336 | 8/2007 | |
| JP | 2007-214481 | 8/2007 | |
| JP | 2008182147 | 8/2008 | |
| JP | 2009517867 | 4/2009 | |
| KR | 10-2005-0119424 | 12/2005 | |
| KR | 1020070064231 | 6/2007 | |
| TW | 497253 | 8/2002 | |
| WO | WO2007/115585 | 10/2007 | |
| WO | WO 2008123352 A1 * | 10/2008 | H01L 29/1054 |

OTHER PUBLICATIONS

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Office Action dated Jun. 25, 2013 from corresponding application No. JP 2010-169487.

(56) References Cited

OTHER PUBLICATIONS

Anathan, Hari, et al., "FinFet SRAM—Device and Circuit Design Considerations", Quality Electronic Design, 2004, Proceedings 5th International Symposium (2004); pp. 511-516.
Jha, Niraj, Low-Power FinFET Circuit Design, Dept. of Electrical Engineering, Princeton University n.d.
Kedzierski, J., et al., "Extension and Source/Drain Design for High-Performance FinFET Devices", IEEE Transactions on Electron Devices, vol. 50, No. 4, Apr. 2003, pp. 952-958.
Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.
Office Action dated Dec. 18, 2012 from corresponding application No. JP 2010-169487.
Office Action dated May 2, 2012 from corresponding application No. CN 201010196345.0.
Office Action dated May 4, 2012 from corresponding application No. CN 201010243667.6.
Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.
Office Action (Decision of Refusal) dated Apr. 28, 2015 from corresponding No. JP 2013-219811.

\* cited by examiner

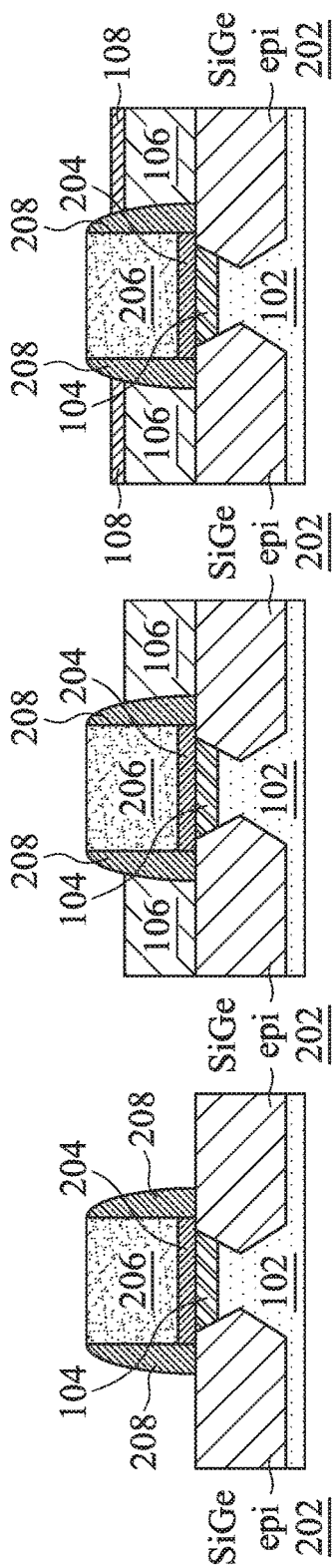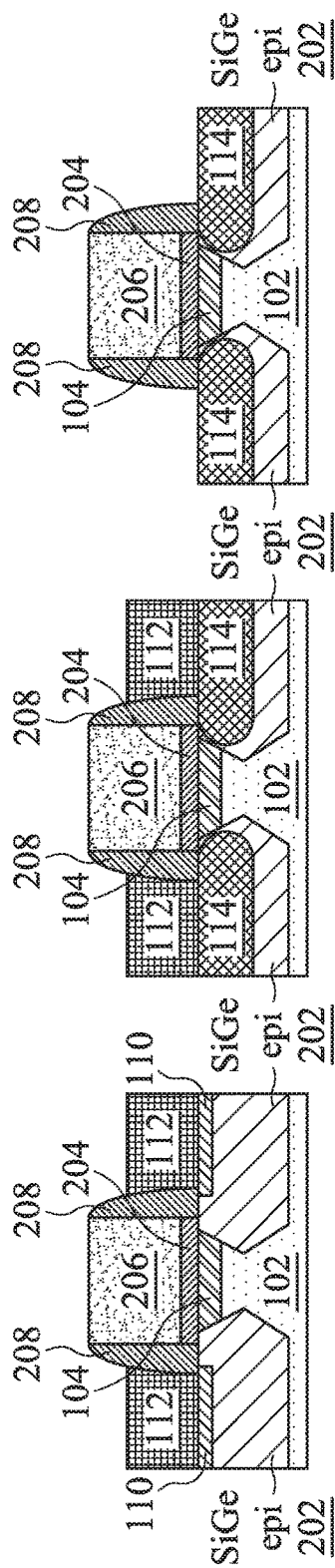

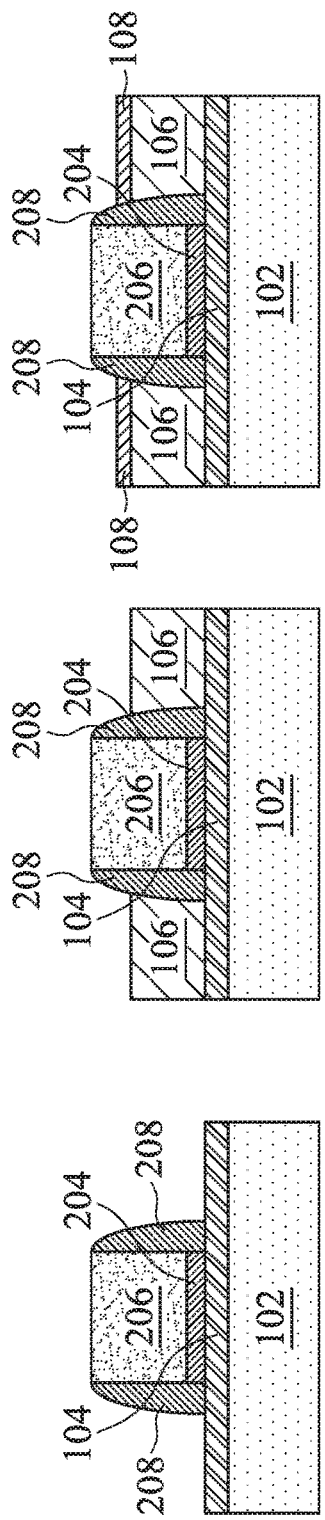
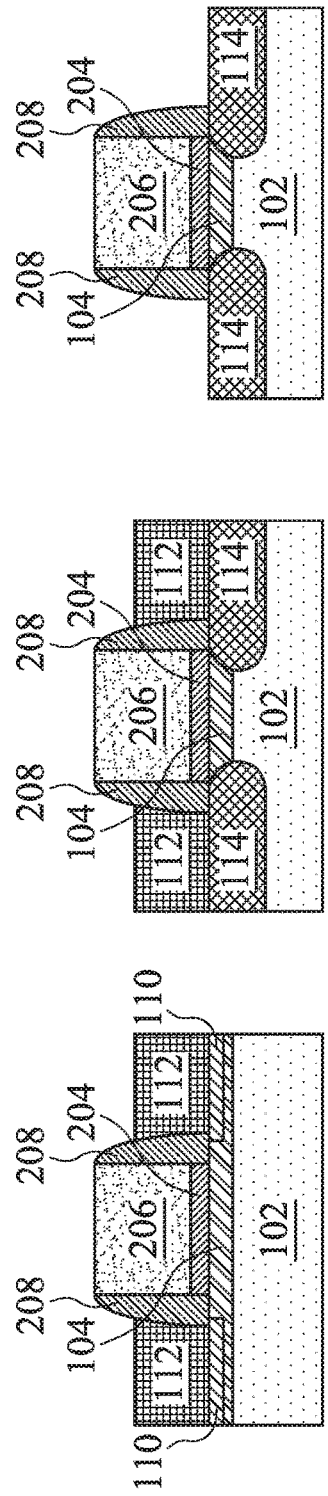
FIG. 3A  FIG. 3B  FIG. 3C
FIG. 3D  FIG. 3E  FIG. 3F

INTEGRATED CIRCUIT TRANSISTOR STRUCTURE WITH HIGH GERMANIUM CONCENTRATION SIGE STRESSOR

CROSS-REFERENCE TO RELATED APPLICATIONS

The present application is a divisional of U.S. application Ser. No. 12/831,842, filed Jul. 7, 2010, which claims priority of U.S. Provisional Application No. 61/229,253, filed Jul. 28, 2009. The above-listed applications are incorporated herein by reference in their entireties.

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

This disclosure relates generally to integrated circuits, and more particularly, to a SiGe source-drain stressor in a semiconductor transistor structure.

BACKGROUND

Strain engineering is employed in semiconductor manufacturing to enhance device performance. Performance benefits are achieved by modulating strain in the transistor channel, which enhances electron mobility (or hole mobility) and thereby conductivity through the channel.

In CMOS technologies, PMOS and NMOS respond differently to different types of strain. Specifically, PMOS performance is best served by applying compressive strain to the channel, whereas NMOS receives benefit from tensile strain. SiGe ($Si_{1-x}Ge_x$), consisting of any molar ratio of silicon and germanium, is commonly used as a semiconductor material in integrated circuits (ICs) as a strain-inducing layer for strained silicon in CMOS transistors.

Strained silicon is a layer of silicon in which the silicon atoms are stretched beyond their normal inter atomic distance. This can be accomplished by putting the layer of silicon over a substrate of silicon germanium (SiGe), for example. As the atoms in the silicon layer align with the atoms of the underlying silicon germanium layer, which are arranged farther apart with respect to those of a bulk silicon crystal, the links between the silicon atoms become stretched—thereby leading to strained silicon.

Currently, the PMOS strain is realized by undercutting the source/drain area and epitaxially growing SiGe film in the undercut region. The larger lattice constant of the SiGe film provides the uniaxial strain to the Si channel. The higher the Ge concentration, the larger the strain and thus better performance. However, the Ge incorporation into the SiGe film is limited by the epitaxial process. Very high Ge concentration SiGe film is difficult to realize using the conventional epitaxial method, which is extremely sensitive to surface preparation, pre-cursors used and growth conditions. It is challenging to meet the ever-increasing Ge concentration requirement and maintain proper control of the SiGe profile for the SiGe source/drain (S/D) in PMOS with epitaxial growth.

BRIEF DESCRIPTION OF THE DRAWINGS

For a more complete understanding of exemplary embodiments of the present invention, and the advantages thereof, reference is now made to the following descriptions taken in conjunction with the accompanying drawings, in which:

FIG. 2A-FIG. 2F illustrate one embodiment of the process for a planar device with strained source drain (SSD);

FIG. 3A-FIG. 3F illustrate another embodiment of the process for a planar device without SSD;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for producing a SiGe stressor with high Ge concentration is provided. This method converts a SiGe film with low Ge concentration into a SiGe film with very high Ge concentration, without the need to epitaxially form a high Ge concentration source/drain (S/D). By having a separate oxidation step and diffusion step for the condensation process, high Ge concentration SiGe profile can be formed and properly controlled. This method is applicable to both planar and FinFET devices on either bulk Si or SOI (silicon on insulator) substrate. Throughout the various views and illustrative embodiments of the present invention, like reference numbers are used to designate like elements.

Figure 1C:
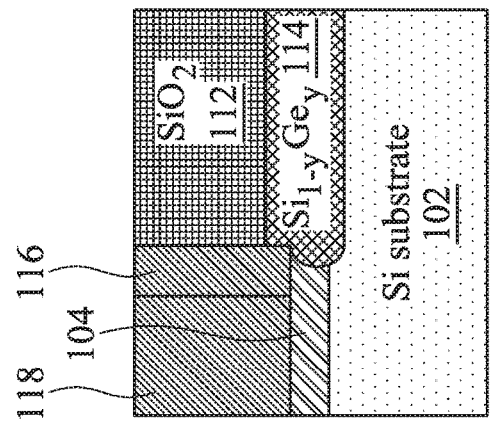
FIG. 1A-FIG. 1C illustrate an exemplary process for SiGe stressor with high Ge concentration according to one embodiment of this invention.
Figure 1B:
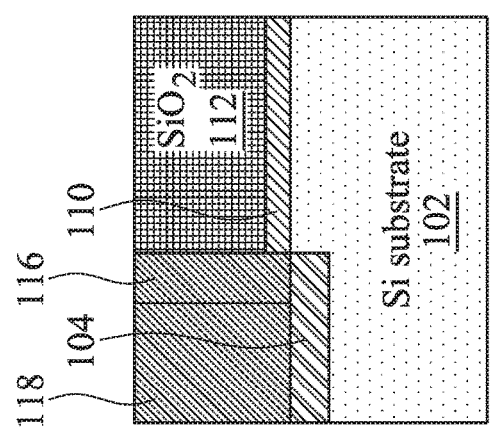
Figure 1A:
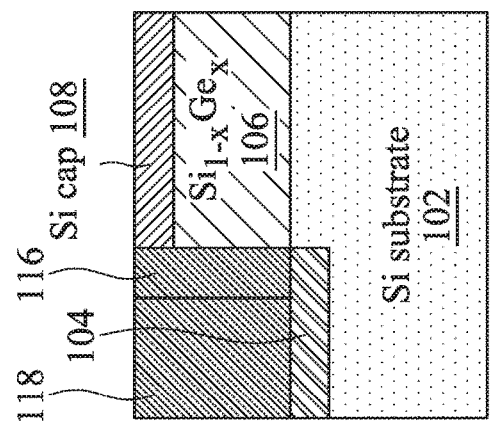

FIGS. 1A-1C illustrate an exemplary process for a SiGe stressor with high Ge concentration. In FIG. 1A, a SiGe film layer 106 and a Si cap layer 108 are deposited on the Si substrate 102 (the substrate 102 can also be SiGe substrate or relaxed SiGe film on Si substrate) beside spacer layer 116 in the S/D area. The channel area 104 below the gate 118 can comprise Si or SiGe channel. The Si cap layer 108 serves as the starting point for oxidation. The oxide quality of a SiGe film in general can be poor and its oxidation front can be hard to control without the Si cap layer 108. Having the Si cap layer 108 helps to form a uniform oxide layer 112 to begin with and makes the overall condensation profile easier to control.

In FIG. 1B, a low temperature thermal oxidation (dry or wet, preferably wet to lower the temperature) is performed to form a localized high Ge percentage SiGe film 110 at the bottom interface with little or completely without Ge diffusion through SiGe/Si interface into the substrate 102. This thermal oxidation step can also comprise at least two stages each with different temperatures and durations to ensure little to no Ge diffusion during the process. In FIG. 1C, a thermal diffusion is performed to form SiGe stressor 114 with the desired profile and depth. Later, the top oxide layer 112 is removed and regular processing can continue. The oxidation and thermal diffusion steps can be combined and performed simultaneously if an optimal temperature can be identified to simultaneously achieve oxidation and desired diffusion profile.

The SiGe film layer 106 has a composition ratio of Si:Ge=1−x: x (i.e., $Si_{1-x}Ge_x$), while the condensed SiGe stressor film 114 has a composition ratio of Si:Ge=1−y:y (i.e. $Si_{1-y}Ge_y$), where x and y represent the Ge percentage in each SiGe film (y>x). The SiGe stressor layer 114 has a higher Ge concentration than deposited SiGe film layer 106, and applies uniaxial compressive strain to the channel 104.

By having a separate (low-temperature) oxidation step and a Ge diffusion step for the condensation process, a higher Ge concentration profile in SiGe S/D stressor film 114 can be formed and properly controlled from the originally deposited SiGe film 106 having a low Ge concentration percentage. Low temperature thermal oxidation (e.g., below 800° C. for x<0.5 and below 600° C. for x approaching 1, where x is the number in $Si_{1-x}Ge_x$) that does not incur Ge diffusion is to obtain a localized, non-diffused high Ge percentage SiGe film 110. This can be achieved through high water vapor pressure wet oxidation, for example.

The two-step process of oxidation and diffusion eliminates the need for silicon on insulator (SOI) substrate in the conventional condensation process, which relies on the presence of oxide to block uncontrolled Ge diffusion. Disclosed embodiments of the present invention are also applicable to three-dimensional (3D) structures. The condensed high Ge concentration SiGe stressor area 114 is naturally close to the surface channel 104, resulting in effective strain on the device channel. Also, disclosed embodiments of the present invention work on high Ge percentage SiGe channel (e.g., $Si_{0.5}Ge_{0.5}$) devices, which by itself alone cannot compete performance-wise against a typical uniaxial strained Si device without further stress from the S/D.

FIGS. 2A-2F illustrate one embodiment of the process for a planar device with strained source drain (SSD). In FIG. 2A, the process starts with SSD and SiGe epi layer 202. The substrate 102, channel 104, dielectric layer 204, gate 206, and sidewall spacer 208 are also shown. In FIG. 2B, a SiGe film 106 (Ge concentration can be either higher or lower than that of 202) is deposited on top of the SiGe epi layer 202. Optionally, a Si cap layer 108 is deposited on top of the SiGe film 106 to help uniform oxidation as shown in FIG. 2C. After low temperature oxidation in FIG. 2D, high Ge percentage SiGe film 110 and oxidation layer 112 are formed. In FIG. 2E, thermal diffusion is performed to form a condensed high Ge concentration SiGe stressor film 114. The Ge concentration of the SiGe film 114 is higher than the original SiGe epi layer 202. In FIG. 2F, the oxide layer 112 can be removed.

FIGS. 3A-3F illustrate another embodiment of the process for a planar device without SSD according to one aspect of this invention. In FIG. 3A, the process starts without SSD. The substrate 102, channel layer 104, dielectric layer 204, gate 206, and sidewall spacer 208 are shown. In FIG. 3B, a SiGe film 106 is deposited on top of the channel layer 104. Optionally, a Si cap layer 108 is deposited on top of the SiGe film 106 to help uniform oxidation as shown in FIG. 3C. After low temperature oxidation in FIG. 3D, high Ge percentage SiGe film 110 and oxidation layer 112 are formed. In FIG. 3E thermal diffusion is performed to form a condensed high Ge concentration SiGe stressor 114. In FIG. 3F, the oxide layer 112 can be removed.

Figure 4A:
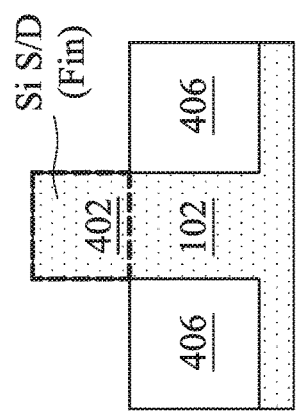
FIG. 4A-FIG. 4F illustrate one embodiment of the process for a FinFET or Trigate device with strained source drain (SSD)
Figure 4B:
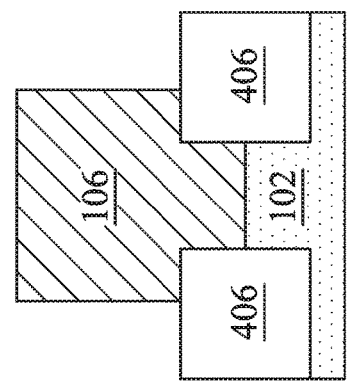
Figure 4C:
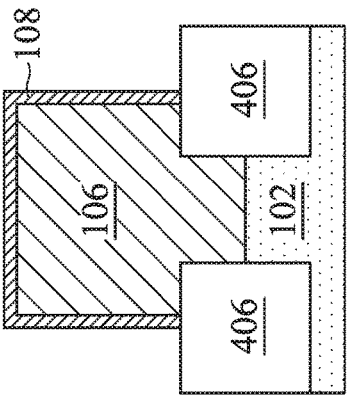
Figure 4D:
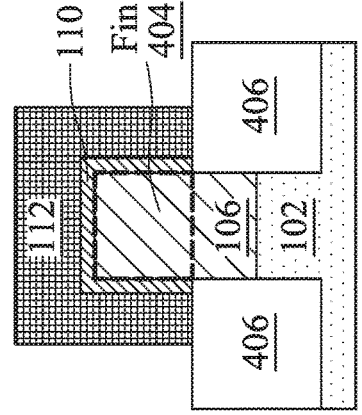
Figure 4E:
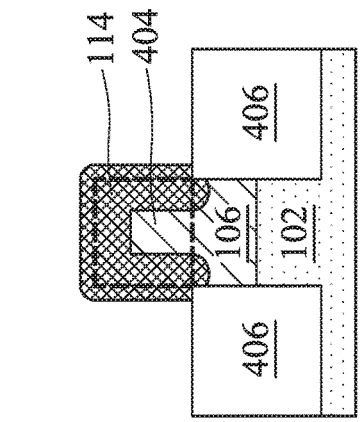
Figure 4F:
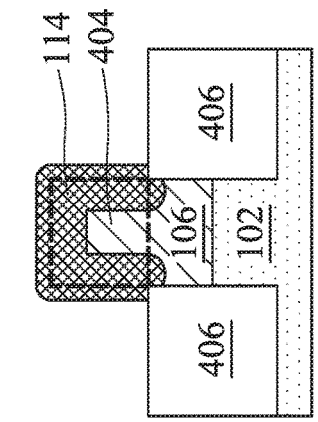

FIGS. 4A-4F illustrate one embodiment of the process for a FinFET device with strained source drain (SSD). FIG. 4A shows a cross section of Si S/D fin area 402 on substrate 102 and shallow trench isolation 406 along a gate direction. In FIG. 4B, anisotropic SSD etch and SiGe epi growth processes are performed on the Si S/D fin area 402 on top of Si substrate 102 to form SiGe film layer 106. In FIG. 4C, a Si cap layer 108 can be optionally deposited on top of the SiGe film 106 to help uniform oxidation. After low temperature oxidation in FIG. 4D, high Ge percentage SiGe film 110 and oxidation layer 112 are formed over the fin area 404. In FIG. 4E, thermal diffusion is performed to form a condensed high Ge concentration SiGe stressor 114. The Ge concentration of the SiGe stressor 114 is higher than the SiGe film 106. It is also possible that the entire S/D area, 404, is uniformly converted to higher Ge concentration SiGe (i.e., 404=114). In FIG. 4F, the oxide layer 112 can be removed.

Figure 5A:
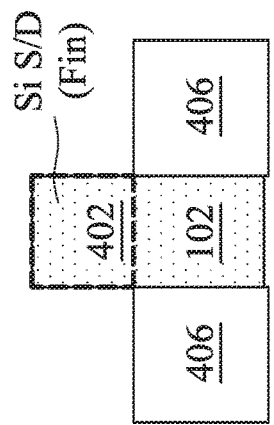
FIG. 5A-FIG. 5F illustrate another embodiment of the process for a FinFET or Trigate device without SSD.
Figure 5B:
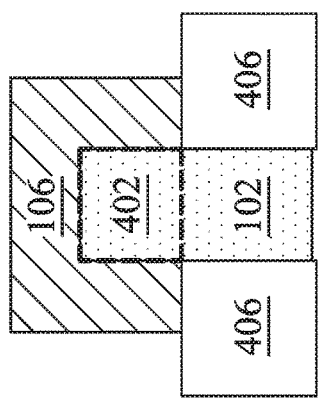
Figure 5C:
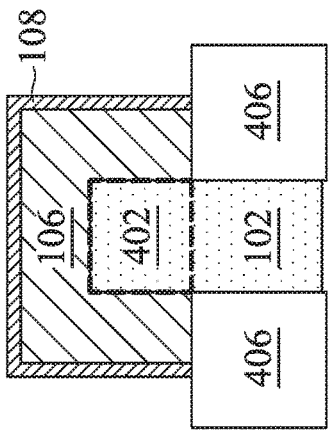
Figure 5D:
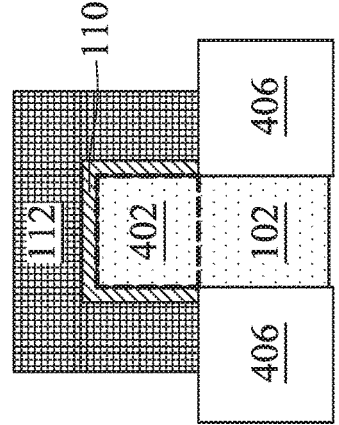
Figure 5E:
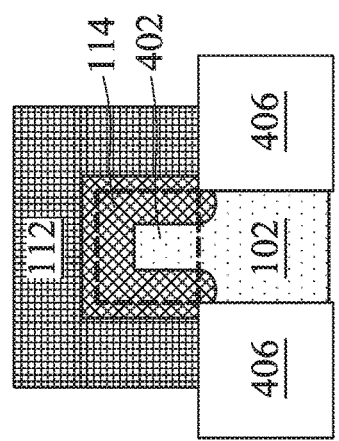
Figure 5F:
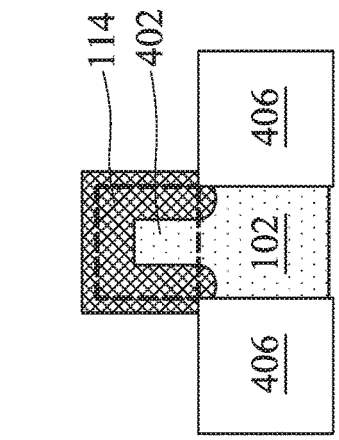

FIGS. 5A-5F illustrate another embodiment of the process for a FinFET device without SSD. FIG. 5A shows a cross section of Si S/D fin area 402 on substrate 102 and shallow trench isolation 406 along a gate direction. In FIG. 5B, a SiGe film layer 106 is grown over the Si S/D Fin area 402 on top of Si substrate 102. In FIG. 5C, a Si cap layer 108 can be optionally deposited on top of the SiGe film 106 to help uniform oxidation. After low temperature oxidation in FIG. 5D, high Ge percentage SiGe film 110 and oxidation layer 112 are formed over the fin area 402. In FIG. 5E, thermal diffusion is performed to form a condensed high Ge concentration SiGe stressor 114. The Ge concentration of the SiGe stressor 114 is higher than the SiGe film 106. Again, it is possible that the entire S/D area, 404, is uniformly converted to higher Ge concentration SiGe. In FIG. 5F, the oxide layer 112 can be removed.

The advantageous features of disclosed embodiments of the present invention include much higher uniaxial compressive stress on the channel achieved without redeveloping a SiGe process that relieves the pressure of forming higher and higher Ge concentration SiGe film with epitaxy, and the elimination of critical thickness constraint, i.e., strained source drain (SSD) depth. Also, the present methods can provide additional uniaxial strain from higher Ge concentration SiGe S/D on SiGe channel on Si substrate structure that already has biaxial strain (e.g., $Si_{0.5}Ge_{0.5}$ channel with SiGe S/D having Ge greater than 50%). A skilled person in the art will appreciate that there can be many embodiment variations.

In some embodiments, an integrated circuit transistor structure comprises a semiconductor substrate, a first SiGe layer in at least one of a source area or a drain area on the semiconductor substrate, and a channel between the source area and the drain area. The first SiGe layer has a Ge concentration of 50 percent or more.

In some embodiments, an integrated circuit transistor structure comprises a semiconductor substrate, a fin structure over the semiconductor substrate, and a first SiGe layer over top and side surfaces of the fin structure.

In some embodiments, an integrated circuit transistor structure comprises a semiconductor substrate, a first SiGe layer over an active region of the semiconductor substrate, and a second SiGe layer under the first SiGe layer. The second SiGe layer has a lower Ge concentration than the first SiGe layer.

Although exemplary embodiments of the present invention and their advantages have been described in detail, it should be understood that various changes, substitutions and alterations can be made herein without departing from the spirit and scope defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure herein, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An integrated circuit transistor structure, comprising:
   a semiconductor substrate;
   a gate disposed on the semiconductor substrate and sidewall spacers abutting the gate;
   a first SiGe layer in at least one of a source area or a drain area on the semiconductor substrate, wherein the first SiGe layer has a Ge concentration greater than 50 percent, and a Si concentration of greater than 0%, and the first SiGe layer is continuous across the source area or the drain area and extends under a portion of the gate and under the sidewall spacers;
   a second SiGe layer under the first SiGe layer, wherein the second SiGe layer has a lower Ge concentration than the first SiGe layer, wherein the second SiGe layer extends under the gate; and
   a channel between the source area and the drain area, wherein the channel comprises SiGe and the Ge concentration of the second SiGe layer is higher than a Ge concentration of SiGe in the channel
   wherein the integrated circuit transistor structure is a planar transistor structure.

2. The structure of claim 1, wherein the semiconductor substrate comprises one selected from the group consisting of Si, SiGe, and a relaxed SiGe film on Si.

3. The structure of claim 1, wherein the first SiGe layer is in both the source area and the drain area.

4. The structure of claim 3, further comprising:
   a second SiGe layer under the first SiGe layer in each of the source area and the drain area,
   wherein the second SiGe layer has a lower Ge concentration than the first SiGe layer.

5. An integrated circuit transistor structure, comprising:
   a semiconductor substrate;
   a fin structure of silicon over the semiconductor substrate;
   a shallow trench isolation feature abutting the fin structure; and
   a first SiGe layer over top and side surfaces of the fin structure, wherein the first SiGe layer interfaces two opposing sidewalls and a top surface of the silicon of the fin structure,
   wherein the first SiGe layer over the side surfaces of the fin structure further extends such that a top surface of the shallow trench isolation feature is higher than a bottommost edge of the first SiGe layer.

6. The structure of claim 5, wherein the semiconductor substrate is silicon.

7. An integrated circuit transistor structure, comprising:
   a semiconductor substrate;
   a fin structure over the semiconductor substrate; and
   a first SiGe layer over top and side surfaces of the fin structure, wherein the fin structure comprises a second SiGe layer and a portion of the fin structure is free of germanium, and
   wherein the second SiGe layer has a lower Ge concentration than the first SiGe layer.

8. The structure of claim 7, wherein the second SiGe layer is the middle portion of the fin structure.

9. The structure of claim 7, wherein the semiconductor substrate comprises one selected from the group consisting of Si, SiGe, and a relaxed SiGe film on Si.

10. The structure of claim 7, wherein the first SiGe layer extends into the semiconductor substrate.

11. The structure of claim 5, wherein
    the first SiGe layer has a first portion lower than a second portion of the fin structure, and
    the second portion has a lower Ge concentration than the first portion.

12. The structure of claim 5, wherein
    the fin structure extends upwardly from a portion of the semiconductor substrate,
    the isolation structure is co-elevational with and contacts the portion of the semiconductor substrate, and
    a portion of the first SiGe layer is disposed on a top surface of the isolation structure.

13. The structure of claim 7, wherein
    the first SiGe layer has a first portion lower than a second portion of the second SiGe layer, and
    the second portion of the second SiGe layer has a lower Ge concentration than the first portion of the first SiGe layer.

14. The structure of claim 7, wherein the second SiGe layer comprises a further portion under the fin structure.

15. The structure of claim 14, wherein the first SiGe layer extends along the side faces of the fin structure and into the further portion of the second SiGe layer.

16. The structure of claim 14, further comprising:
    an isolation structure over the semiconductor substrate, wherein the isolation structure is co-elevational with and contacts the further portion of the second SiGe layer, and the first SiGe layer overlaps a boundary between the isolation structure and the further portion of the second SiGe layer.

* * * * *